United States Patent
Tan

(10) Patent No.: US 8,615,328 B2
(45) Date of Patent: Dec. 24, 2013

(54) NOISE REDUCTION APPARATUS, METHOD, AND CONTAINER DATA CENTER INCLUDING THE SAME

(75) Inventor: Zeu-Chia Tan, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 487 days.

(21) Appl. No.: 12/975,532

(22) Filed: Dec. 22, 2010

(65) Prior Publication Data

US 2012/0118555 A1    May 17, 2012

(30) Foreign Application Priority Data

Nov. 12, 2010   (TW) ................................ 99138936 A

(51) Int. Cl.
*G06F 19/00*   (2011.01)

(52) U.S. Cl.
USPC .......................................... 700/276; 340/544

(58) Field of Classification Search
USPC ........ 700/276, 291, 278; 340/544; 165/104.3, 165/80.2, 300; 29/890.3; 454/184
See application file for complete search history.

(56) References Cited

U.S. PATENT DOCUMENTS

| | | | |
|---|---|---|---|
| 6,374,627 B1* | 4/2002 | Schumacher et al. | 62/259.2 |
| 6,522,252 B2* | 2/2003 | Horibe et al. | 340/544 |
| 7,538,509 B1* | 5/2009 | Glover et al. | 318/481 |
| 2004/0243280 A1* | 12/2004 | Bash et al. | 700/245 |
| 2005/0137824 A1* | 6/2005 | Augustin et al. | 702/132 |
| 2007/0171613 A1* | 7/2007 | McMahan et al. | 361/695 |
| 2010/0010678 A1* | 1/2010 | Dawson et al. | 700/276 |
| 2011/0014862 A1* | 1/2011 | Honold et al. | 454/184 |
| 2011/0238236 A1* | 9/2011 | Tozer et al. | 700/300 |
| 2013/0107448 A1* | 5/2013 | Hamburgen et al. | 361/679.47 |

FOREIGN PATENT DOCUMENTS

| | | |
|---|---|---|
| TW | I262648 | 9/2006 |
| TW | I288524 | 10/2007 |
| TW | M348931 | 1/2009 |
| TW | 200923557 A | 6/2009 |

* cited by examiner

*Primary Examiner* — Kidest Bahta
(74) *Attorney, Agent, or Firm* — Altis Law Group, Inc.

(57) ABSTRACT

A noise reduction apparatus is mounted in a container data center. The container data center includes a container and a number of servers mounted inside the container. The noise reduction apparatus includes a first sensor, a number of fan adjusting systems, and a number of temperature sensors. The first sensor is mounted at an entrance of the container. When a user enters the container, the first sensor outputs a first control signal. The fan adjusting systems slow down fans in the servers according to the first control signal. When the user leaves the container, the first sensor outputs a second control signal. The fan adjusting systems speed up the fans according to the second control signal. The temperature sensors sense temperatures inside the servers respectively. The fan adjusting systems further speed up the fans when the temperatures exceed a preset temperature.

14 Claims, 4 Drawing Sheets

NOISE REDUCTION APPARATUS, METHOD, AND CONTAINER DATA CENTER INCLUDING THE SAME

BACKGROUND

1. Technical Field

The present disclosure relates to a noise reduction apparatus, a noise reduction method, and a container data center including the noise reduction apparatus.

2. Description of Related Art

In a container data center hundreds of servers may be operating at the same time. When the servers are working, the fans of the servers generate excessive noise. As a result, it is not comfortable for users when the users go into the container data center.

BRIEF DESCRIPTION OF THE DRAWINGS

Many aspects of the present embodiments can be better understood with reference to the following drawing. The components in the drawing are not necessarily drawn to scale, the emphasis instead being placed upon clearly illustrating the principles of the present embodiments. Moreover, in the drawing, all the views are schematic, and like reference numerals designate corresponding parts throughout.

DETAILED DESCRIPTION

The disclosure, including the accompanying drawing, is illustrated by way of examples and not by way of limitation. It should be noted that references to "an" or "one" embodiment in this disclosure are not necessarily to the same embodiment, and such references mean at least one.

Figure 1:
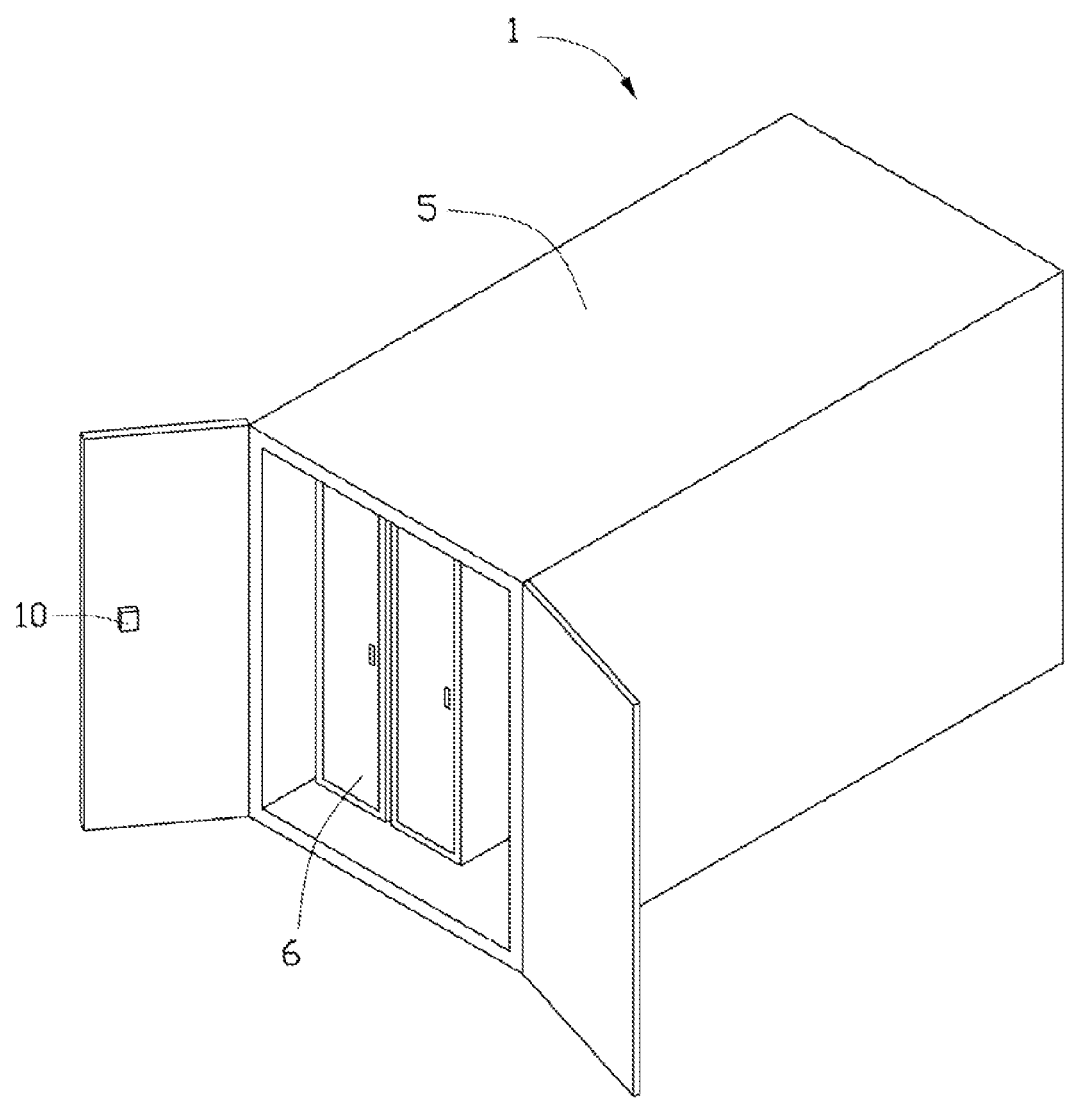
FIG. 1 is a schematic diagram of an exemplary embodiment of a container data center.
Figure 2:
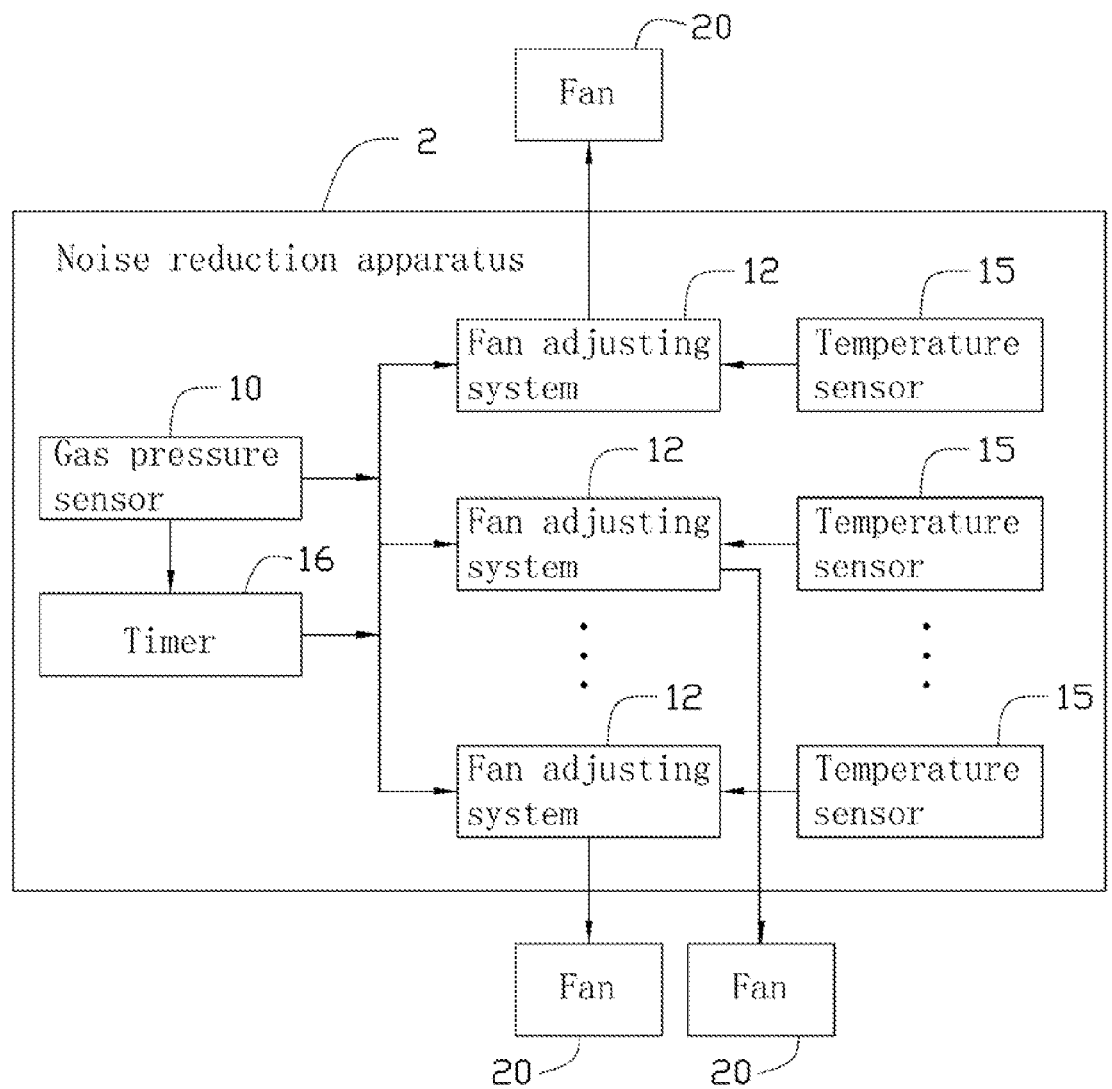
FIG. 2 is a block diagram of an exemplary embodiment of a noise reduction apparatus of the container data center of FIG. 1.

Referring to FIGS. 1 and 2, an exemplary embodiment of a container data center 1 includes a portable container 5, a plurality of servers 6 accommodated in the container 5, and a noise reduction apparatus 2 mounted in the container 5.

The noise reduction apparatus 2 includes a gas pressure sensor 10, a plurality of fan adjusting systems 12, a plurality of temperature sensors 15, and a timer 16. Each fan adjusting system 12 and a corresponding temperature sensor 15 are mounted in a corresponding server 6. The gas pressure sensor 10 is connected to the timer 16 and the fan adjusting systems 12. The timer 16 is further connected to the fan adjusting systems 12. Each temperature sensor 15 is connected to a corresponding fan adjusting system 12.

The gas pressure sensor 10 is mounted at an entrance of the container 5, when a user enters the container 5, atmospheric pressure at the entrance of the container 5 changes. As a result, the gas pressure sensor 10 outputs a first control signal to the fan adjusting systems 12 and the timer 16. The timer 16 starts to time according to the first control signal, when the user leaves the container 5, the atmospheric pressure at the entrance of the container 5 changes again. As a result, the gas pressure sensor 10 outputs a second control signal to the fan adjusting systems 12 and the timer 16. In other embodiments, other sensors, such as an infrared sensor, can replace the gas pressure sensor 10.

The fan adjusting system 12 includes smart software to adjust the fans in the server 6 according to the first control signal. In the embodiment, the fan adjusting system 12 may adjust the duty cycle of pulse width modulation (PWM) signals to adjust the fan 20. The users can preset the duty cycle. For example, when the fan adjusting system 12 receives the first control signal from the gas pressure sensor 10, the fan adjusting system 12 reduces the duty cycle of the PWM signals to 80 percent. As a result, the fan in the server 6 slows down to reduce the noise.

The temperature of an element in the server 6, such as a central processing unit (CPU), may rise along with the lower rotation speed of the fan 20 in the server 6. For example, the temperature of the CPU in the server 6 is 70 degrees centigrade when the fan is operating in full. After the duty cycle of the PWM signals is reduced to 80 percent, the temperature of the CPU in the server 6 would rise to 74 degrees centigrade. However, the temperature of the CPU in the server 6 being at 74 degrees centigrade for a short time, such as half an hour, will not damage the CPU.

Each temperature sensor 15 senses the temperature of the element in the corresponding server 6, and transmits the temperature to the corresponding fan adjusting system 12. When the temperature of the CPU exceeds a preset temperature (such as 76 degrees centigrade), the fan adjusting system 12 increases the duty cycle of the PWM signals to speed up the fan 20 in the corresponding server 6. In the embodiment, the users may preset the increment. For example, the users can increase the duty cycle of the PWM signals 6 percent per 10 seconds.

When the timer 16 reaches a preset time, such as half an hour, the timer 16 outputs a third control signal to the fan adjusting systems 12. The fan adjusting systems 12 increase the duty cycle of the PWM signals to speed up the fans 20 in the servers 6. In the embodiment, the increment may be still preset by the users. For example, the users can increase the duty cycle of the PWM signals 2 percent per 10 seconds. Moreover, the preset time may be changed according to need. In addition, the timer 16 can be omitted.

When the user leaves the container 5, the atmospheric pressure at the entrance of the container 5 changes again. As a result, the gas pressure sensor 10 outputs the second control signal to the fan adjusting systems 12 and the timer 16. The fan adjusting systems 12 increase the duty cycle of the PWM signals to speed up the fans 20 in the servers 6 if the fans 20 are not working at full power. The timer 16 stops counting time and is reset.

Figure 3:
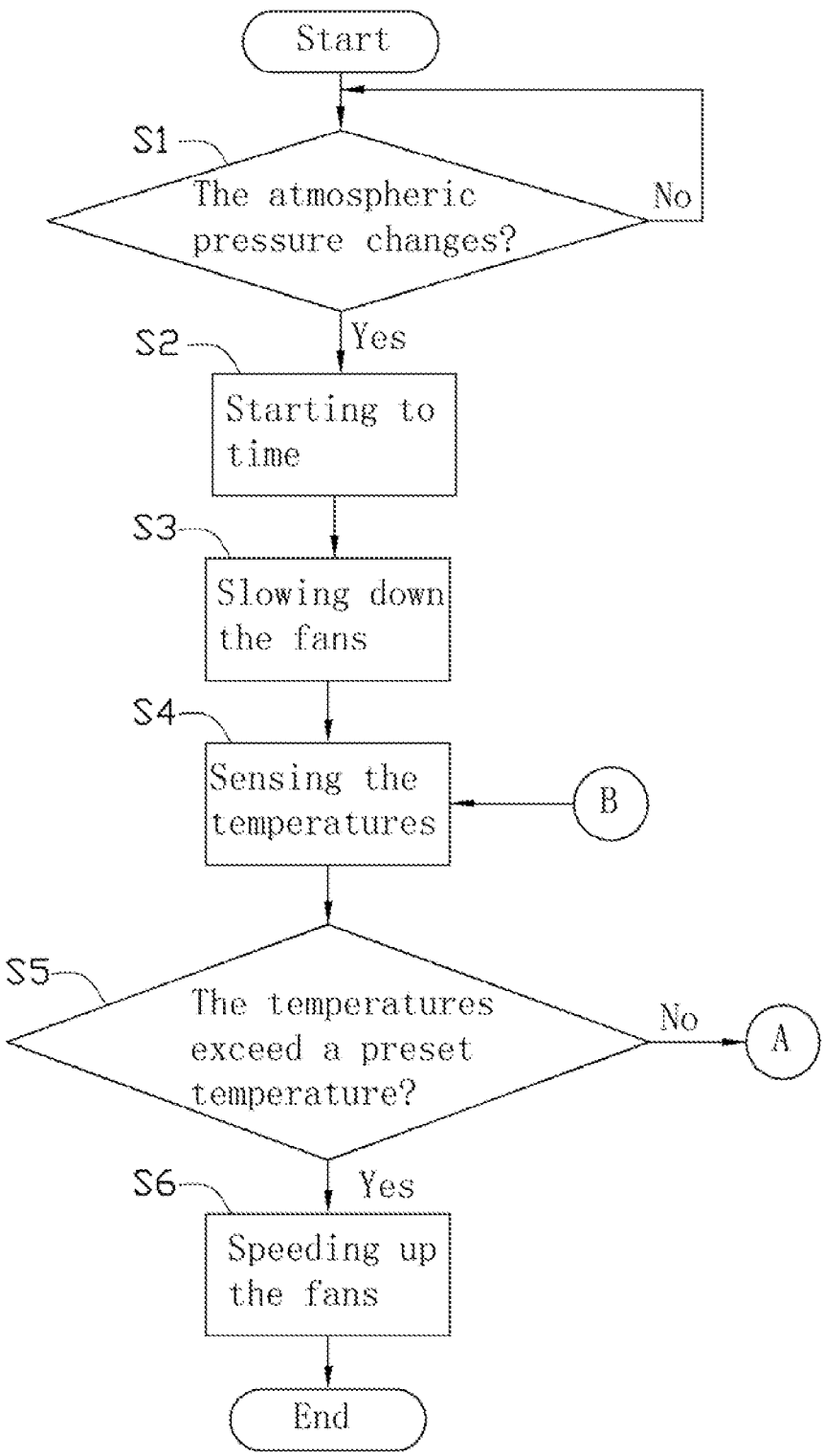
FIGS. 3 and 4 are a flowchart of an exemplary embodiment of a noise reduction method for the container data center of FIG. 1.
Figure 4:
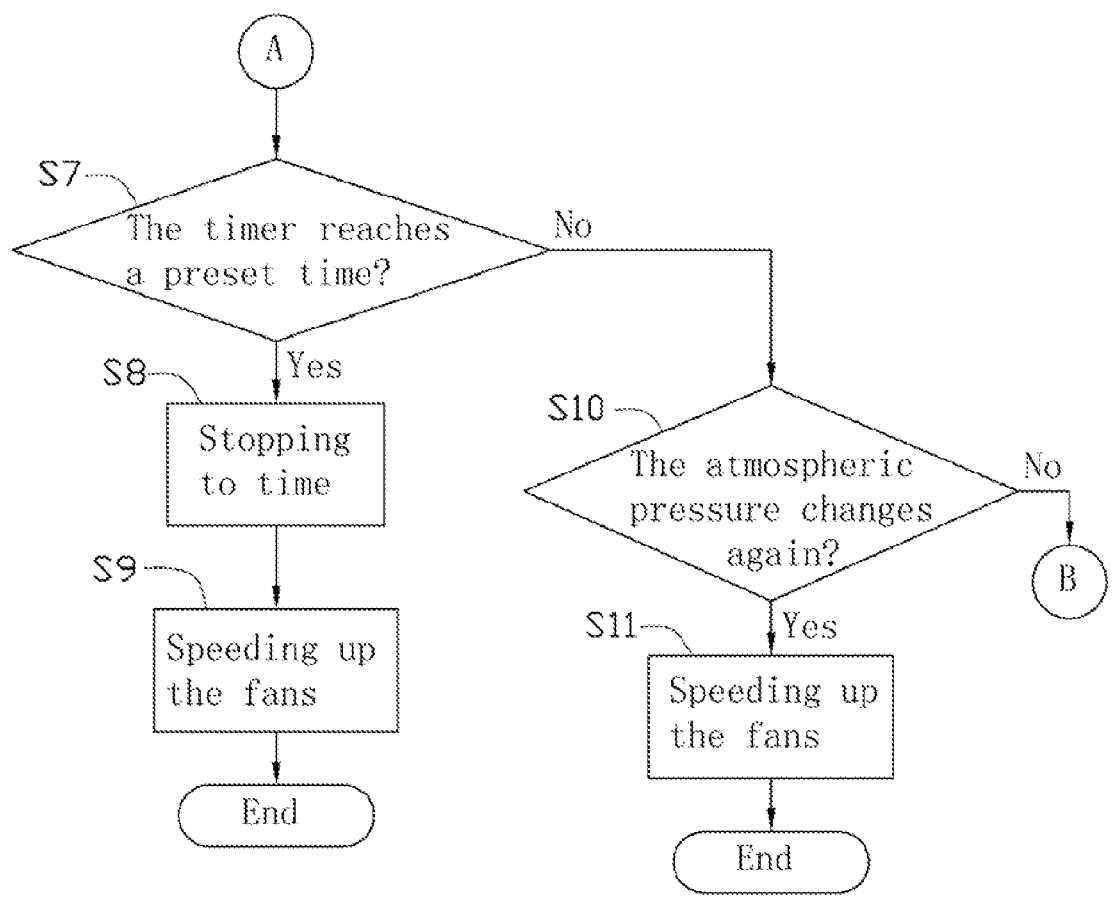

Referring to FIGS. 3 and 4, an exemplary embodiment of noise reduction method includes the following steps.

In step S1, the gas pressure sensor 10 senses the atmospheric pressure at the entrance of the container 5 and determines whether the atmospheric pressure changes. When the atmospheric pressure changes, namely, the user enters the container 5, the process flows to step S2. When the atmospheric pressure does not change, namely the user does not enter the container 5, step S1 is repeated.

In step S2, the timer 16 starts to time.

In step S3, the fan adjusting systems 12 reduces the duty cycle of the PWM signals to 80 percent. As a result, the fans 20 in the servers 6 slow down to reduce the noise in the container 5.

In step S4, the temperature sensors 15 sense the temperatures of the CPUs in the servers, and transmit the temperatures sensed to the fan adjusting systems 12 correspondingly.

In step S5, the fan adjusting systems 12 determine whether the temperatures of the CPUs exceed a preset temperature. When the temperature of a CPU exceeds the preset temperature, the process flows to step S6. When the temperature of the CPU does not exceed the preset temperature, the process flows to step S7.

In step S6, the fan adjusting system 12 increases the duty cycle of the PWM signals to speed up the fan 20 in the server 6. For example, the users can increase the duty cycle of the PWM signals 2 percent per 10 seconds.

In step S7, the fan adjusting systems 12 determine whether the timer 16 reaches a preset time. If the timer 16 reaches the preset time, the process flows to step S8. If the timer 16 does not reach the preset time, the process flows to step S10.

In step S8, the timer 16 stops timing and is reset.

In step S9, the fan adjusting systems 12 increase the duty cycle of the PWM signals to speed up the fans 20 in the servers 6. For example, the users can increase the duty cycle of the PWM signals 2 percent per 10 seconds.

In step S10, the gas pressure sensor 10 senses the atmospheric pressure at the entrance of the container 5 and determines whether the atmospheric pressure changes again. When the atmospheric pressure changes again, namely the user leaves the container 5, the process flows to step S11. When the atmospheric pressure does not change, namely the user does not leave the container 5, the process flows back to step S4.

In step S11, the fan adjusting systems 12 increase the duty cycle of the PWM signals to speed up the fans 20 in the servers 6.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A noise reduction apparatus mounted in a container data center, the container data center comprising a portable container and a plurality of servers accommodated in the container, each server comprising a fan, the noise reduction apparatus comprising:
   a first sensor mounted at an entrance of the container, wherein when a user enters the container through the entrance, the first sensor outputs a first control signal, and when the user leaves the container through the entrance, the first sensor outputs a second control signal;
   a plurality of fan adjusting systems, wherein each fan adjusting system corresponds to a server, the plurality of fan adjusting systems slow down the plurality of fans according to the first control signal, and speed up the plurality of fans according to the second control signal; and
   a plurality of temperature sensors, wherein each temperature sensor corresponds to a server to sense temperature inside the corresponding server, the plurality of temperature sensors transmit the temperatures to the plurality of fan adjusting systems respectively, each fan adjusting system speeds up the fan when the corresponding temperature exceeds a preset temperature.

2. The noise reduction apparatus of claim 1, further comprising a timer, wherein the timer starts to time according to the first control signal, when the timer reaches a preset time, the timer outputs a third control signal, the fan adjusting systems speed up the fans in the servers according to the third control signal.

3. The noise reduction apparatus of claim 1, wherein the first sensor is a gas pressure sensor.

4. The noise reduction apparatus of claim 1, wherein the first sensor is an infrared sensor.

5. The noise reduction apparatus of claim 1, wherein the fan adjusting systems adjust duty cycle of pulse width modulation signals to slow down or speed up the fans.

6. A container data center comprising:
   a container;
   a plurality of servers accommodated in the container; and
   a noise reduction apparatus comprising:
      a first sensor mounted at an entrance of the container, wherein when an user enters the container, the first sensor outputs a first control signal, when the user leaves the container, the first sensor outputs a second control signal;
      a plurality of fan adjusting systems, wherein each fan adjusting system corresponds to a server, the plurality of fan adjusting systems slow down a plurality of fans in the servers according to the first control signal, and speed up the plurality of fans according to the second control signal; and
      a plurality of temperature sensors, wherein each temperature sensor corresponds to a server to sense temperature inside the corresponding server, the plurality of temperature sensors transmit the temperatures to the plurality of fan adjusting systems respectively, each fan adjusting system speeds up the fan when the corresponding temperature exceeds a preset temperature.

7. The container data center of claim 6, whether the noise reduction apparatus further comprises a timer, the timer starts to time according to the first control signal, when the timer reaches a preset time, the timer outputs a third control signal, the fan adjusting systems speed up the fans in the servers according to the third control signal.

8. The container data center of claim 6, wherein the first sensor is a gas pressure sensor.

9. The container data center of claim 6, wherein the first sensor is an infrared sensor.

10. The container data center of claim 6, wherein the fan adjusting systems adjust duty cycle of pulse width modulation signals to slow down or speed up the fans.

11. A noise reduction method used for a container data center, the container data center comprising a container and a plurality of servers accommodated in the container, the noise reduction method comprising:
   determining whether a user enters the container;
   slowing down a plurality of fans in the plurality of servers by a plurality of fan adjusting systems correspondingly when the user enters the container;
   sensing temperatures inside the plurality of servers by a plurality of temperature sensors respectively;
   determining whether the temperatures exceed a preset temperature; and
   speeding up a fan when the temperature inside a corresponding server exceeds the preset temperature.

12. The noise reduction method of claim 11, further comprising:
starting to time by a timer when the user enters the container;
determining whether the timer reaches a preset time; and
speeding up the fans when the timer reaches the preset time.

13. The noise reduction method of claim 11, further comprising:
determining whether the user leaves the container; and
speeding up the fans when the user leaves the container.

14. The noise reduction method of claim 11, wherein the step "determining whether a user enters the container" comprises:
sensing atmospheric pressure at an entrance of the container and determining whether the atmospheric pressure at the entrance changes;
when the atmospheric pressure at the entrance changes, it is determined that the user enters the container; and
when the atmospheric pressure at the entrance does not change, it is determined that the user does not enter the container;
wherein the step "determining whether the user leaves the container" comprises:
sensing atmospheric pressure at an entrance of the container and determining whether the atmospheric pressure at the entrance changes again;
when the atmospheric pressure at the entrance changes again, it is determined that the user leaves the container; and
when the atmospheric pressure at the entrance does not change again, it is determined that the user does not leave the container.

\* \* \* \* \*